United States Patent
Hirakoso et al.

(10) Patent No.: US 7,390,440 B2
(45) Date of Patent: Jun. 24, 2008

(54) PROCESS FOR PRODUCING METAL-CONTAINING PARTICLES HAVING THEIR SURFACE COATED WITH AT LEAST TWO DISPERSANTS DIFFERENT IN VAPORIZATION TEMPERATURE

(75) Inventors: Hideyuki Hirakoso, Yokohama (JP); Keisuke Abe, Yokohama (JP); Yasuhiro Sanada, Yokohama (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 11/501,801

(22) Filed: Aug. 10, 2006

(65) Prior Publication Data

US 2006/0266156 A1 Nov. 30, 2006

Related U.S. Application Data

(63) Continuation of application No. PCT/JP2005/004119, filed on Mar. 9, 2005.

(30) Foreign Application Priority Data

Mar. 10, 2004 (JP) ............................. 2004-068065

(51) Int. Cl.
*H01B 1/00* (2006.01)
*H01B 1/12* (2006.01)

(52) U.S. Cl. ..................... 252/500; 174/126.7; 174/257; 427/195; 428/403; 528/482

(58) Field of Classification Search ................ 252/500, 252/512; 423/1; 117/68; 75/371; 106/401; 427/195; 174/126.7, 257; 428/403; 528/482
See application file for complete search history.

(56) References Cited

U.S. PATENT DOCUMENTS

| | | | | |
|---|---|---|---|---|
| 5,792,514 | A * | 8/1998 | Dieter et al. | 427/195 |
| 6,103,868 | A * | 8/2000 | Heath et al. | 528/482 |
| 6,159,396 | A * | 12/2000 | Fujita et al. | 252/572 |
| 6,358,611 | B1 * | 3/2002 | Nagasawa et al. | 428/403 |
| 6,589,312 | B1 * | 7/2003 | Snow et al. | 75/255 |
| 6,645,444 | B2 * | 11/2003 | Goldstein | 423/1 |
| 6,730,400 | B1 * | 5/2004 | Komatsu et al. | 428/403 |
| 6,872,249 | B2 * | 3/2005 | Peng et al. | 117/68 |
| 7,081,214 | B2 * | 7/2006 | Matsuba et al. | 252/512 |
| 7,160,525 | B1 * | 1/2007 | Peng et al. | 423/1 |
| 2003/0084820 | A1 * | 5/2003 | Okamoto et al. | 106/401 |
| 2003/0107024 | A1 * | 6/2003 | Tai et al. | 252/500 |
| 2003/0146019 | A1 * | 8/2003 | Hirai | 174/257 |
| 2006/0070493 | A1 | 4/2006 | Hirakoso et al. | |
| 2007/0246245 | A1 * | 10/2007 | Ahn et al. | 174/126.2 |

FOREIGN PATENT DOCUMENTS

| | | |
|---|---|---|
| EP | 1825940 | * 11/2005 |
| JP | 2794009 | 6/1998 |
| JP | 2000-504374 | 4/2000 |
| JP | 2002-126869 | 5/2002 |
| JP | 2002-317215 | * 10/2002 |
| JP | 2002-324966 | 11/2002 |
| JP | 2002-334618 | 11/2002 |
| JP | 3402214 | 2/2003 |
| JP | 2003-187640 | 7/2003 |
| JP | 2004-18891 | 1/2004 |
| JP | 2004-51997 | 2/2004 |
| JP | 2004-183009 | * 7/2004 |
| JP | 2005/81501 | 3/2005 |
| WO | 97/24224 | 7/1997 |
| WO | 00/76699 | 12/2000 |

OTHER PUBLICATIONS

Kang et al., "Compartive Study of Dodecanethiol-Derivatized Silver Nanoparticles Prepared in One-Phase and Two-Phase Systems", 1998, Langmuir, vol. 14, pp. 226-230.*
Brust et al., "Synthesis of Thiol-derivatised Gold Nanoparticles in a Two-phase Liquid—Liquid System", 1994, J. Chem. Soc., Chem. Commun., pp. 801-802.*
Brust et al., "Synthesis and Reactions of Functionalised Gold Nanoparticles", 1995, J. Chem. Soc., Chem. Commun., pp. 1655-1656.*
U.S. Appl. No. 11/501,801, filed Aug. 10, 2006, Hirakoso et al.
K. Abe et al, "Anti-Reflective Coatings for CRTs by Sol-Gel Process", *Journal of Sol-Gel Science and Technology*, 2001, vol. 22, pp. 151-166.

* cited by examiner

*Primary Examiner*—Mark Kopec
*Assistant Examiner*—Khanh T Nguyen
(74) *Attorney, Agent, or Firm*—Oblon, Spivak, McClelland, Maier & Neustadt, P.C.

(57) ABSTRACT

To provide metal-containing fine particles having good dispersion stability, which have their surface coated with dispersants vaporizable even during firing at low temperatures, a fine particle dispersion having the above metal-containing fine particles dispersed therein, and an electroconductive metal-containing material having an excellent volume resistivity formed by using the fine particle dispersion. Metal-containing fine particles with their surface coated with at least two dispersants having different vaporization temperatures.

8 Claims, No Drawings

US 7,390,440 B2

PROCESS FOR PRODUCING METAL-CONTAINING PARTICLES HAVING THEIR SURFACE COATED WITH AT LEAST TWO DISPERSANTS DIFFERENT IN VAPORIZATION TEMPERATURE

TECHNICAL FIELD

The present invention relates to metal-containing fine particles, a fine particle dispersion having the metal-containing fine particles dispersed therein, a process for producing the fine particle dispersion, and an electroconductive metal-containing material formed from the fine particle dispersion.

BACKGROUND ART

In recent years, various methods have been studied to form an electric conductor by forming a pattern employing a fine particle dispersion having metal-containing fine particles dispersed in a liquid, followed by a heat treatment (hereinafter referred to simply also as "firing") so that the metal fine particles are mutually sintered. Such methods may, for example, be a method of carrying out formation and repair of a circuit pattern such as a printed wiring, formation of an interlayer wiring in semiconductor packages, and joining of printed wiring boards and electronic components, by means of an ink jet printing method (e.g. Patent Document 1), a method of joining metals which replaces conventional soldering (e.g. Patent Document 2), and a method of forming an electrically conductive metal film capable of replacing a plated film in the field of electronic materials (e.g. Patent Document 3).

The above-described methods employ known nature called surface melting of metal particles (e.g. Non-patent Document 1). It is generally known that the surface melting of metal particles takes place due to abnormal lattice vibration of atoms at the surface of the particles, and that the smaller the particle diameter and the higher the proportion of surface atoms, the more the surface melting temperature decreases. For example, in a case of silver, it is known that bulk silver has a melting point of about 970° C., whereas fine particles (colloid) having diameters of about 10 nm undergo the surface melting at a temperature of about 80° C. Since the surface melting depends on the particle diameter of the metal particles, it takes place even in an association state so long as individual metal fine particles have a predetermined particle diameter, unless particles are completely bound.

In order to disperse metal fine particles in a liquid, it is common to use a dispersant to prevent agglomeration. Here, in order to achieve excellent dispersion of the metal fine particles in an organic solvent, it is necessary to form a great steric hindrance on the surface of the fine particles. However, when a great steric hindrance is to be formed, it tends to be required to have the dispersant highly polymerized or to increase the amount of the dispersant to be added. Further, in a case where an electric conductor is to be formed by employing a fine particle dispersion having metal fine particles dispersed, if the highly polymerized dispersant is used or the amount of the dispersant is increased, the dispersant can not be removed unless firing is carried out at a high temperature, whereby it tends to be difficult to obtain electrical conductivity.

Further, the lower the firing temperature the better, from the viewpoint of problems of the heat resistance of a board in wiring on printed wiring boards or an element is in wiring in semiconductor packages.

Patent Document 1: JP-A-2002-324966
Patent Document 2: JP-A-2002-126869
Patent Document 3: JP-A-2002-334618

Non-patent Document 1: "J. Sol-Gel Science and Technology", The Netherlands, Kluwer Academic Publishers, 2001, vol. 22, p. 151-166

DISCLOSURE OF THE INVENTION

Problems that the Invention is to Solve

Accordingly, it is an object of the present invention to provide metal-containing fine particles having good dispersion stability, which have their surface coated with a dispersant vaporizable even by firing at a low temperature, a fine particle dispersion having such metal-containing fine particles dispersed therein, and an electroconductive metal-containing material having an excellent volume resistivity formed by using the fine particle dispersion.

Means to Solve Problems

The present inventors have conducted an extensive study to solve the above problems and as a result, have found that metal-containing fine particles having their surface coated with at least two dispersants different in vaporization temperature have good dispersion stability, and an electroconductive metal-containing material which can be formed by firing at a low temperature (150 to 210° C.) employing a fine particle dispersion having the metal-containing material dispersed therein, is excellent in the volume resistivity. The present invention has been accomplished on the basis of these discoveries. Namely, the present invention provides the following.

(1) Metal-containing fine particles having their surface coated with at least two dispersants different in vaporization temperature. (First embodiment)

(2) The metal-containing fine particles according to the above (1), which are dispersed in a fine particle dispersion to be used for firing at a prescribed firing temperature, and which have their surface coated with a dispersant to be vaporized at a temperature lower than the above firing temperature and a dispersant to be vaporized at a temperature of the above firing temperature or higher.

(3) A fine particle dispersion, wherein the metal-containing fine particles as defined in the above (1) or (2) are dispersed in a water-insoluble organic liquid. (Second embodiment)

(4) A process for producing the fine particle dispersion as defined in the above (3), which comprises a step of adding water to a water-soluble metal-containing compound to obtain an aqueous solution containing metal ions; a step of adding a water-insoluble organic liquid having the above at least two dispersants different in vaporization temperature dissolved therein, to the above aqueous solution; and a step of adding, after the above addition of the organic liquid, a reducing agent with stirring to reduce the above metal ions and produce metal-containing fine particles having their surface coated with the above at least two dispersants different in vaporization temperature. (Third embodiment)

(5) A process for producing the fine particle dispersion as defined in the above (3), which comprises a step of obtaining an aqueous solution containing citric ions and ferric ions, a step of adding, to the above aqueous solution, an aqueous solution containing ions of at least one metal selected from the group consisting of gold, silver, platinum, palladium, tungsten, tantalum, bismuth, lead, indium, tin, titanium and aluminum, with stirring to reduce the metal ions to obtain a liquid containing metal-containing fine particles, and a step of adding, to the above liquid containing the metal-containing fine particles, a water-insoluble organic liquid having the above at least two dispersants different in vaporization temperature dissolved therein, with stirring, to produce metal-containing fine particles having their surface coated with the above at least two dispersants different in vaporization temperature.

(6) An electroconductive metal-containing material having a volume resistivity of at most 60 μΩcm, formed by coating an object to be coated, with the fine particle dispersion as defined in the above (3), followed by firing at a temperature between the highest vaporization temperature and the lowest vaporization temperature among the vaporization temperatures of the above at least two dispersants. (Fourth embodiment)

EFFECT OF THE INVENTION

As will be described below, the present invention is useful since it provides metal-containing fine particles having good dispersion stability, which have their surface coated with a dispersant vaporizable even by firing at a low temperature, a fine particle dispersion having the metal-containing fine particles dispersed therein, and an electroconductive metal-containing material excellent in volume resistivity formed by using the fine particle dispersion.

Especially, the present invention is very useful since by using the fine particle dispersion as the second embodiment (hereinafter referred to simply also as "the fine particle dispersion of the present invention") as an ink for ink jet printing, formation and repair of a circuit pattern such as printed wiring, formation of interlayer wiring in semiconductor packages, and joining of printed wiring boards and electronic components can be carried out at a lower temperature, and a material to be thereby formed is also excellent in electroconductivity.

BEST MODE FOR CARRYING OUT THE INVENTION

Now, the present invention will be described in detail.

The metal-containing fine particles as the first embodiment of the present invention (hereinafter referred to simply also as "the metal-containing fine particles of the present invention") are metal-containing fine particles having their surface coated with at least two dispersants different in vaporization temperature. Particularly, they may suitably be, for example, metal-containing fine particles which are dispersed in a fine particle dispersion to be used for firing at a prescribed firing temperature, and which have their surface coated with a dispersant (hereinafter referred to simply also as "the first dispersant")to be vaporized at a temperature lower than the firing temperature and a dispersant (hereinafter referred to simply also as "the second dispersant") to be vaporized at a temperature of the firing temperature or higher.

Here, "the firing temperature" is meant for a temperature at the time of firing when the after-mentioned electroconductive metal-containing material as the fourth embodiment of the present invention (hereinafter referred to simply also as "the electroconductive metal-containing material of the present invention"), is formed, particularly, a temperature at the time of firing after the fine particle dispersion of the present invention is applied on an object to be coated, and such firing temperature can optionally be set within the prescribed range. As mentioned above, from the viewpoint of heat resistance of a board in wiring of printed wiring boards or an element in wiring in semiconductor packages, it is preferably within a range of from 150 to 210° C., more preferably within a range of from 150 to 200° C.

Further, in the present invention, the firing is meant for a step of dissociating the dispersants which are applied on the surface of the metal-containing fine particles and further mutually fusing the metal-containing fine particles after the dissociation of the dispersants.

Further, "coated with" is meant for a state where at least one part of the surface of the metal-containing fine particles is coated with the dispersants, particularly, a state where an organic compound having a substituent containing a nitrogen atom, an oxygen atom or a sulfur atom as a substituent which can bond to a metal element contained in metal-containing fine particles, is bonded to at least one part of the surface of the metal-containing fine particles. Further, with respect to the coating with the dispersants, in the after-mentioned process for producing the fine particle dispersion as the third embodiment of the present invention (hereinafter referred to simply also as "the process for producing the fine particle dispersion of the present invention"), if the production is carried out by using only a dispersant having a low vaporization temperature (about from 30 to 60° C.), by using no dispersant, or by using an organic compound having no substituents which can bond to a metal element, instead of the dispersants, no dispersant can effectively be applied on the surface of the metal-containing fine particles, and the metal-containing fine particles tend to agglomerate, whereby a stabilized fine particle dispersion can not be produced. Whereas, in the present invention, such a coated state can be confirmed also from the fact that it is possible to produce a fine particle dispersion having metal-containing fine particles dispersed therein.

The metal-containing fine particles of the present invention contain at least one metal selected from the group consisting of gold (Au), silver (Ag), copper (Cu), platinum (Pt), palladium (Pd), tungsten (W), nickel (Ni), tantalum (Ta), bismuth (Bi), lead (Pb), indium (In), tin (Sn), titanium (Ti) and aluminum (Al). Among them, it is particularly preferred that Au, Ag, Cu or Ni is incorporated, and it is most preferred that Cu is incorporated.

Further, in the present invention, "metal-containing fine particles" is an expression for a concept including both metal fine particles themselves (such as Au colloid or Ag colloid), and metal hydride fine particles (such as copper hydride (CuH) colloid).

Accordingly, the metal-containing fine particles of the present invention may be Au colloid, Ag colloid or the like, or CuH colloid or the like, having the surface coated with at least two dispersants different in vaporization temperature.

Now, the dispersants will be described in detail.

As at least two dispersants different in vaporization temperature, which are applied on the surface of the metal-containing fine particles of the present invention, the first dispersant and the second dispersant may be mentioned as mentioned above. They are organic compounds having a substituent containing a nitrogen atom, an oxygen atom or a sulfur atom as a substituent which can be coordinated to a metal element contained in the metal-containing fine particles.

Here, "the first dispersion" is meant for a dispersant having a vaporization temperature lower than the above firing temperature, and "the second dispersant" is similarly meant for a dispersant having a vaporization temperature of the firing temperature or higher. Further, in the present invention, the vaporization temperature is meant for a temperature at the time when 50% of the charged mass has been vaporized in a case where the measurement is carried out by means of a thermogravimetric analysis under the following measuring conditions.

MEASURING CONDITIONS

Initiation temperature for measurement: 25° C.
Heating rate: 10° C./min
Atmosphere: nitrogen atmosphere (flow rate: 20 ml/min)
Charged weight: 10 mg
Cell used: made of aluminum (5 μL)

Such dispersants are not particularly limited so long as they are organic compounds having a substituent containing a nitrogen atom, an oxygen atom or a sulfur atom, as a substituent which can be coordinated to a metal element contained in the metal-containing fine particles, as mentioned above, and the carbon number is preferably from 4 to 25, more preferably from 8 to 23. The carbon number is preferably within such a range, whereby they will be thermally stable, their vapor pressure will be appropriate, and their handling efficiency will be good. Further, the range of the carbon number is preferably within such a range, whereby they can sufficiently be vaporized even if the firing is carried out at a low temperature, and it is possible to obtain favorable dispersion stability of the metal-containing fine particles with their surface coated with such dispersants.

Further, the above dispersants may be either unsaturated or saturated, and preferably have a linear long-chain (for example, a decyl group or a dodecyl group).

Further, the vaporization temperature of the above dispersants is preferably from 125 to 235° C.

Particularly, the organic compound having a substituent containing a nitrogen atom may be a compound having a substituent such as an amino group or an amido group. The organic compound having a substituent containing an oxygen atom may be a compound having a substituent such as a hydroxyl group or an etheric oxy group (—O—), and the organic compound having a substituent containing a sulfur atom may be a compound having a substituent such as a sulfanyl group (—SH) or a sulfide type sulfanediyl group (—S—).

More particularly, a compound having a substituent such as an amino group or an amido group may, for example, be octylamine (155° C.), decylamine (170° C.), dodecylamine (180° C.), tetradecylamine (190° C.), hexadecylamine (200° C.), octadecylamine (205° C.), methyloctadecylamine (210° C.), dimethyloctadecylamine (215° C.), oleylamine (205° C.), benzylamine (140° C.), laurylamide, stearylamide or oleylamide. The compound having a substituent such as a hydroxyl group or an etheric oxy group (—O—) may, for example, be dodecanediol, hexadecanediol, dodecanoic acid (200° C.), stearic acid (225° C.), oleic acid (225° C.) linoleic acid, linolenic acid, dodecanedione, dibenzoylmethane, ethylene glycol monodecyl ether (200° C.), diethylene glycol monodecyl ether, triethylene glycol monodecyl ether, tetraethylene glycol monodecyl ether, ethylene glycol monododecyl ether (210° C.), diethylene glycol monododecyl ether, triethylene glycol monododecyl ether, tetraethylene glycol monododecyl ether, ethylene glycol monocetyl ether (225° C.) or diethylene glycol monocetyl ether. The compound having a substituent such as a sulfanyl group (—SH) or a sulfide type sulfanediyl group (—S—) may, for example, be decanethiol (190° C.), dodecanediol (205° C.), tetradecanethiol (220° C.), trimethylbenzyl mercaptan, butylbenzyl mercaptan or hexylsulfide. Here, the numbers in parentheses are vaporization temperatures measured under the above-mentioned measuring conditions.

Among such dispersants, in the present invention, at least two dispersants different in vaporization temperature are suitably selected. Particularly, among such dispersants, the first dispersant and the second dispersant can suitably be selected and used (in combination).

For example, if the firing temperature is 150° C., combination of benzylamine and octylamine, combination of benzylamine and decylamine and combination of benzylamine and dodecylamine may, for example, be mentioned. If the firing temperature is 180° C., combination of decylamine and tetradecylamine, combination of octylamine and tetradecylamine and combination of octylamine and dodecanoic acid may, for example, be mentioned. If the firing temperature is 190° C., combination of dodecylamine and dodecanoic acid, combination of dodecylamine and tetradecylamine may, for example, be mentioned. If the firing temperature is 195° C., combination of tetradecylamine and dodecanoic acid and combination of tetradecylamine and hexadecylamine may, for example, be mentioned. If the firing temperature is 200° C., combination of dodecylamine and octadecylamine, combination of dodecylamine and methyloctadecylamine, combination of tetradecylamine and dimethyloctadecylamine or combination of dodecylamine and dodecanethiol may, for example, be mentioned. If the firing temperature is 210° C., combination of hexadecylamine and dimethyloctadecylamine, combination of dodecanoic acid and tetradecanethiol or combination of hexadecylamine and tetradecanethiol may, for example, be mentioned.

Further, in the present invention, the difference between the firing temperature and the vaporization temperature of the first dispersant is preferably within 25° C., and likewise, the difference between the firing temperature and the vaporization temperature of the second dispersant is also preferably within 25° C. Further, the difference between the vaporization temperatures of the first dispersant and the second dispersant is preferably within 30° C.

It is preferred that the surface of the metal-containing fine particles is coated with such dispersants by adding them in a total amount of from 2 to 100 parts by mass, preferably from 2 to 20 parts by mass, based on 100 parts by mass of the metal-containing fine particles. The above range is preferred since the dispersion stability of the metal-containing fine particles obtainable will be good.

Particularly, as shown in the process for producing the fine particle dispersion of the present invention or in the after-mentioned Examples, a method may suitably be exemplified, wherein the metal-containing fine particles formed by reduction by means of a wet process and a water-insoluble organic liquid having dispersants dissolved therein, are stirred to have the surface of the metal-containing fine particles coated with a dispersant. And, a so-called dry process may also be applicable.

Further, in the dispersants to be used, the proportion (charged mass ratio) of the first dispersant and the second dispersant is preferably such that the first dispersant is from 60 to 95 mass %, preferably from 70 to 90 mass %, based on the total charged mass of the dispersants.

The metal-containing fine particles of the present invention, which have their surface coated with such dispersants, has an average particle diameter of about from 1 to 100 nm, and even if the fine particle dispersion having the metal-containing fine particles dispersed is left to stand at room temperature for 1 month, no agglomeration will take place, i.e., a good dispersion stability can be maintained, and such metal-containing fine particles can be present stably in a colloidal state.

In the present invention, the average particle diameter is measured by means of a transmission electron microscope (TEM) or a scanning electron microscope (SEM). Further, particle diameters of fine particles mean particle diameters of observed primary particles, and the average particle diameter is defined as an average diameter of randomly sampled 100 fine particles among observed fine particles.

Further, the dispersants coating the surface of the metal-containing fine particles of the present invention will be dissociated by firing, whereby the metal-containing fine particles after dissociation of the dispersant will be mutually fused to form a bulk product. Thus, the after-mentioned electroconductive metal-containing material of the present invention shows the electrical conductivity and the heat resistance.

The fine particle dispersion as the second embodiment of the present invention is a fine particle dispersion, wherein the above-mentioned metal-containing fine particles as the first embodiment of the present invention are dispersed in a water-insoluble organic liquid.

Here, the above organic liquid is preferably one having low polarity and having good affinity to the dispersants which are applied on the surface of the above metal-containing fine particles. Further, the organic liquid is preferably such that it is relatively quickly evaporated by heating after application when the after-mentioned electroconductive metal-containing material of the present invention is to be formed, and that it has thermal stability so that it will not undergo thermal decomposition.

Such an organic liquid may, for example, be hexane, heptane, octane, decane, dodecane, tetradecane, dodecene, tetradecene, cyclohexane, ethylcyclohexane, butylcyclohexane, cyclooctane, terpineol, hexanol, octanol, cyclohexanol, toluene, xylene, ethylbenzene, mesitylene, butylbenzene, α-terpene, γ-terpene, limonene or AF solvent (tradename, manufactured by Nippon Oil Corporation). They may be used alone, or two or more of them may be used in combination.

Further, the fine particle dispersion of the present invention is not particularly limited since it is suitably selected depending upon the purpose of its use, but is preferably one having the organic liquid added in an amount of from 20 to 500 parts by mass, more preferably from 20 to 200 parts by mass, based on 100 parts by mass of the above metal-containing fine particles. Namely, the concentration of the above metal-containing fine particles in the fine particle dispersion of the present invention is preferably from 15 to 80 mass %, more preferably from 30 to 80 mass % based on the organic liquid.

If the concentration of the metal fine particles is within such a range, it is possible to adequately secure the electrical conductivity of the electroconductive metal-containing material of the present invention obtainable by applying the fine particle dispersion obtainable, followed by firing. Further, the properties such as the viscosity, surface tension, etc. of the fine particle dispersion obtainable will be good, and coating can readily be carried out, such being preferred.

Further, to the fine particle dispersion of the present invention, an additive (such as a plasticizer or a thickener), an organic binder or the like may be added, as the case requires.

The use of the fine particle dispersion of the present invention is not particularly limited, but it is extremely useful since, by using it as ink by means of an ink jet printing method, formation and repair of a circuit pattern such as printed wiring, formation of interlayer wiring in semiconductor packages, and joining of printed wiring boards and electronic components can be carried out at a low temperature, and a material to be formed also has excellent electrical conductivity.

The process for producing the fine particle dispersion, as the third embodiment of the present invention, is a process for producing the above-mentioned fine particle dispersion as the second embodiment of the present invention, which comprises a step of adding water to a water-soluble metal-containing compound to obtain an aqueous solution containing metal ions; a step of adding a water-insoluble organic liquid having the above at least two dispersants different in vaporization temperature dissolved therein, to the above aqueous solution; and a step of adding, after the above addition of the organic liquid, a reducing agent with stirring to reduce the above metal ions and produce metal-containing fine particles having their surface coated with the dispersants.

When the metal-containing fine particles of the present invention are to be formed, by stirring an aqueous layer comprising the aqueous solution containing the metal ions and an oil layer comprising the above at least two dispersants different in vaporization temperature and an organic liquid, a suspension (emulsion) comprising moisture components and oil components will be formed. In the moisture components of the suspension, the metal ions are reduced by the reducing agent separately added, to obtain metal-containing fine particles in a state before coating the surface. It is considered that the surface of the obtained fine particles is quickly covered with the above at least two dispersants dissolved in the oil components to form the metal-containing fine particles of the present invention having their surface coated with the dispersants, and absorbed in the oil components and stabilized.

When the suspension is left to stand after the metal-containing fine particles are thus formed, the suspension will be separated into two layers of an aqueous layer and an oil layer. The separated oil layer is recovered, whereby a fine particle dispersion having the metal-containing fine particles dispersed in the water-insoluble organic liquid will be obtained.

The fine particle dispersion can be used as it is or after having another additive (such as a plasticizer or a thickener) suitably added thereto, as a so-called ink for formation of an electroconductive metal-containing material.

As the water-soluble metal-containing compound to be used in the process for producing the fine particle dispersion of the present invention, particularly, copper sulfate, copper chloride, copper acetate, copper bromide, copper iodide, copper citrate or copper nitrate; silver acetate, silver citrate or silver nitrate; sodium chloroaurate or chloroaurate; nickel bromide, nickel acetate, nickel nitrate or nickel chloride; or the like may suitably be exemplified.

Further, the above metal-containing compound is preferably dissolved to have a concentration of from 0.1 to 30 mass %. If the concentration of the aqueous solution having a metal-containing compound dissolved, i.e. the aqueous solution containing metal ions, is within such a range, the efficiency for formation of the metal-containing fine particles obtainable will be good and the dispersion stability will be also good, such being preferred.

In the process for producing the fine particle dispersion of the present invention, for example, in order to obtain the CuH colloid as mentioned above, it is preferred that the pH of the aqueous solution containing metal ions is adjusted to at most 3. Particularly, it is preferred that an acid is added to the aqueous solution containing metal ions.

As the acid to be added for adjusting the pH to at most 3, particularly, citric acid, malonic acid, maleic acid, phthalic acid, acetic acid, propionic acid, sulfuric acid, nitric acid, hydrochloric acid or the like may be mentioned. By adjusting the pH to at most 3, the metal ions in the aqueous solution will be readily obtainable as the metal-containing fine particles by the action of the reducing agent to be added later.

The reducing agent is preferably a metal hydride which has a high reducing effect. Particularly, lithium hydride, potassium hydride, calcium hydride, lithium aluminum hydride, lithium borohydride, sodium borohydride, hydrazine or dimethyl amine borane may, for example, be mentioned. Among them, aluminum lithium hydride, lithium borohydride or sodium borohydride is preferred, since it is excellent in the reduction rate and safety.

Further, it is preferred that the reducing agent is added in an amount of from 1.5 to 10 times by mol equivalent to the metal ions. If the amount of the reducing agent is within such a range, the reducing effect will be sufficient and the dispersion stability of the metal-containing fine particles obtainable will be good, such being preferred.

On the other hand, the fine particle dispersion of the present invention may be produced by a production process which comprises a step of obtaining an aqueous solution containing citric ions and ferric ions; a step of adding, to the above aqueous solution, an aqueous solution containing ions of at least one metal selected from the group consisting of gold, silver, platinum, palladium, tungsten, tantalum, bismuth, lead, indium, tin, titanium and aluminum, with stirring to reduce the metal ions to obtain a liquid containing metal-containing fine particles; and a step of adding, to the above liquid containing the metal-containing fine particles, a water-insoluble organic liquid having the above at least two dispersants different in vaporization temperature dissolved therein, with stirring, to produce metal-containing fine particles having their surface coated with the above dispersants.

The electroconductive metal-containing material as the fourth embodiment of the present invention is an electroconductive metal-containing material having a volume resistivity of at most 60 μΩcm, preferably at most 40 μΩcm, more preferably at most 20 μΩcm, particularly preferably at most 10 μΩcm, which is formed by coating an object to be coated, with the fine particle dispersion according to the above-mentioned second embodiment of the present invention, followed by firing at a temperature between the highest vaporization temperature and the lowest vaporization temperature among the vaporization temperatures of the above at least two dispersants.

In the present invention, the volume resistivity is a value calculated from the resistance measured by means of a four-probe ohmmeter and the film-thickness measured by means of a bench-top surface profiler.

Here, as a method of coating with the fine particle dispersion, a conventional method may be employed. Particularly, ink jet printing, screen printing, a roll coater, an air knife coater, a blade coater, a bar coater, a gravure coater, a die coater, a spray coater or a slide coater may, for example, be mentioned. Among them, coating by ink jet printing is preferred since it is thereby easy to cope with microsizing or to change the printing pattern.

Further, in the case of coating by ink jet printing, it is preferred that the ink discharge nozzle is at a level of 20 μm, and the diameter of ink droplets varies during flying after discharge, and after the ink droplets arrive at an object to be coated, they spread thereon. The diameter of the ink immediately after discharge is at a level of the diameter of the discharge nozzle, but after arriving at the object, it changes to a level of from 5 to 100 μm. Accordingly, in a case where the fine particle dispersion of the present invention is used as an ink, associated fine particles in the ink may be large so long as the ink viscosity and the like are not affected, and the diameter after agglomerated and associated may be at a level of 2 μm.

An object to be coated with the above fine particle dispersion, is not particularly limited, and as a specific example, e.g. a glass plate or a resin substrate of e.g. an epoxy resin may be mentioned.

Firing at a firing temperature is meant for firing of the fine particle dispersion applied on an object to be coated at a firing temperature to be determined depending upon the vaporization temperature of the dispersants to be used, as mentioned above. Thus, the metal-containing fine particles in the fine particle dispersion are fused to form a bulk body, whereby an electroconductive metal-containing material having a volume resistivity of at most 60 μΩcm is formed.

The reason why the volume resistivity of the electroconductive metal-containing material of the present invention lowers, is not clearly understood in detail, but the present inventors consider it as follows.

First, in a case where the vaporization temperature of a single dispersant or all of a plurality of dispersants is higher than the firing temperature, it is considered that no dispersant can sufficiently be dissociated from the surface of the metal-containing fine particles even by the firing, whereby such a dispersant remains on the interface during fusing the metal-containing fine particles by the firing, thus causing electroconductivity hindrance to increase the volume resistivity. Second, in a case where the vaporization temperature of a single dispersant or the vaporization temperatures, all of a plurality of dispersants are lower than the firing temperature, such a dispersant or dispersants are dissociated from the surface of the metal-containing fine particles by the firing, such being preferred from the viewpoint of electroconductivity hindrance. However, it is considered that since only the effect of the thermal vibration of metal-containing fine particles can be expected for the initiation of fusing, fusion of the metal-containing fine particles hardly proceeds, whereby the volume resistivity will be increased.

Whereas, in the present invention, the surface is coated with a plurality of dispersants having vaporization temperatures having a relation with the firing temperature, and the dispersant having a low vaporization temperature (the first dispersant), being present in a large amount, contributes to the dispersion stability in the vicinity of room temperature, but it is vaporized before the firing and thus causes no electroconductive hindrance. On the other hand, the dispersant having a high vaporization temperature (the second dispersant), being present in a small amount, brings the metal fine particles to be close to one another by an effect such as surface tension on the surface of the metal-containing fine particles, thereby to accelerate fusing between the metal-containing fine particles, whereby the volume resistivity is considered to be decreased. Further, since the dispersant having a high vaporization temperature, being present in a small amount, scarcely remains after the firing, it is considered that such a dispersant is vaporized (azeotropically) together with the dispersant having a lower vaporization temperature, being present in a large amount, while bringing the metal fine particles to be close to one another.

For the purpose of further improving the electrical conductivity of the electroconductive metal-containing material of the present invention, heating, ultraviolet ray irradiation, X-ray irradiation, electron ray irradiation or the like may further be applied, in addition to the firing.

As the heating, particularly, hot air heating or thermal radiation may, for example, be mentioned.

As the ultraviolet ray irradiation, particularly, a low pressure UV lamp having a main wavelength of 254 nm or a high pressure UV lamp having a main wavelength of 365 nm may, for example, be used.

EXAMPLES

Now, the present invention will be described in further detail with reference to Examples. However, it should be understood that the present invention is by no means limited to such Examples.

Further, the vaporization temperature was measured by a thermogravimetry (model: H-9000, manufactured by Shimadzu Corporation) under the following measuring conditions. The volume resistivity was calculated from the resistance measured by a four-probe ohmmeter (model: Loresta IPMCP-T250, manufactured by Mitsubishi Petrochemical Co., Ltd.) and the film-thickness measured by a stylus profiler (model: Dektak 6M, manufactured by Veeco Instruments Inc.).

MEASURING CONDITIONS

Initiation temperature for measurement: 25° C.
Heating rate: 10° C./min
Atmosphere: nitrogen atmosphere (flow rate: 20 ml/min)
Charged weight: 10 mg
Cell used: made of aluminum (5 μL)

Examples 1-1 to 1-9, Comparative Examples 1-11 to 1-19, Reference Examples 1-21 to 1-24

CuH Colloid

In a glass container, 5 g of copper(II) chloride dihydrate was dissolved in 150 g of distilled water to obtain an aqueous solution. To this aqueous solution, 90 g of a 40% citric acid aqueous solution (concentration as calculated by mass, the same applies hereinafter) was added, and further a solution having 0.08 g of dodecylamine and 0.02 g of methyloctadecylamine dissolved in 10 g of xylene was added thereto. After completion of the addition, while the solution was vigorously stirred, 150 g of a 3% sodium borohydride aqueous solution was slowly dropwise added thereto. After completion of the dropwise addition, the solution was left to stand for 1 hour to be separated into an aqueous layer and an oil layer, and then the oil layer alone was recovered to obtain a black fine particle dispersion having CuH colloidal particles dispersed.

The fine particle dispersion obtained was applied on a glass substrate and dried, and then the deposit thus formed was fired in a nitrogen atmosphere at 200° C. for 1 hour, whereby a metal film having a metal copper color with a gloss was formed. The volume resistivity of the metal film was measured, and as a result, it was 5 μΩcm. Here, the vaporization temperature of dodecylamine was 180° C., and the vaporization temperature of methyloctadecylamine was 210° C.

In the same manner, a fine particle dispersion was prepared except that dispersant 1 was used instead of dodecylamine and dispersant 2 was used instead of methyloctadecylamine, firing was carried out for 1 hour at a prescribed firing temperature to form a metal film, and the volume resistivity was measured. As a result, the dispersants 1 and 2, and the firing temperature are shown in the following Table 1 (No. 1). Further, with respect to a case of using one type of dispersant as in Comparative Examples, and a case of using two types of dispersants but not corresponding to Examples in the fourth embodiment because of the relation between the vaporization temperature and the firing temperature, as in Reference Examples, fine particle dispersions were prepared, and the volume resistivity of the metal film was measured in the same manner as in Examples. The results are shown in the following Table 1 (No. 2) and Table 1 (No. 3). Here, in the following Table 1 (No. 2) and Table 1 (No. 3), "X" represents "not measurable".

TABLE 1 (No. 1)

| Example | Dispersant 1 Vaporization temperature | Dispersant 2 Vaporization temperature | Firing temperature (° C.) | Volume resistivity (μΩcm) |
|---|---|---|---|---|
| 1-1 | Dodecylamine 180° C. | Methyl-octadecylamine 210° C. | 200° C. | 5 |
| 1-2 | Tetradecylamine 190° C. | Dimethyl-octadecylamine 215° C. | 200° C. | 7 |
| 1-3 | Hexadecylamine 200° C. | Dimethyl-octadecylamine 215° C. | 210° C. | 9 |
| 1-4 | Dodecylamine 180° C. | Octadecylamine 205° C. | 200° C. | 8 |
| 1-5 | Dodecylamine 180° C. | Dodecanoic acid 200° C. | 190° C. | 15 |
| 1-6 | Dodecylamine 180° C. | Dodecanethiol 205° C. | 200° C. | 7 |
| 1-7 | Tetradecylamine 190° C. | Dodecanoic acid 200° C. | 195° C. | 10 |
| 1-8 | Dodecanoic acid 200° C. | Tetradecanethiol 220° C. | 210° C. | 11 |
| 1-9 | Hexacylamine 200° C. | Tetradecanethiol 220° C. | 210° C. | 9 |

TABLE 1 (No. 2)

| Comparative Example | Dispersant 1 Vaporization temperature | Dispersant 2 Vaporization temperature | Firing temperature (° C.) | Volume resistivity (μΩcm) |
|---|---|---|---|---|
| 1-11 | Dodecylamine 180° C. | — | 200° C. | X |
| 1-12 | Tetradecylamine 190° C. | — | 200° C. | 500 |
| 1-13 | Hexadecylamine 200° C. | — | 210° C. | 750 |
| 1-14 | Dodecanoic acid 200° C. | — | 210° C. | 1,000 |
| 1-15 | Dodecylamine 180° C. | — | 150° C. | 150 |
| 1-16 | Tetradecylamine 190° C. | — | 180° C. | 70 |
| 1-17 | Hexadecylamine 200° C. | — | 180° C. | 80 |
| 1-18 | Dodecanoic acid 200° C. | — | 190° C. | 110 |

TABLE 1 (No. 3)

| Reference Example | Dispersant 1 Vaporization temperature | Dispersant 2 Vaporization temperature | Firing temperature (° C.) | Volume resistivity (μΩcm) |
|---|---|---|---|---|
| 1-21 | Methyl-octadecylamine 210° C. | Dodecylamine 180° C. | 220° C. | X |
| 1-22 | Dimethyl-octadecylamine 215° C. | Tetradecylamine 190° C. | 230° C. | X |
| 1-23 | Hexadecylamine 200° C. | Tetradecylamine 190° C. | 180° C. | 90 |
| 1-24 | Dimethyl-octadecylamine 215° C. | Hexadecylamine 200° C. | 190° C. | 100 |

Comparative Example 1-19

A fine particle dispersion was prepared in the same manner as in Example 1-1 except that 0.1 g of propylamine (vaporization temperature: 40° C.) was used instead of 0.08 g of dodecylamine and 0.02 g of methyloctadecylamine.

Each fine particle dispersion in Examples 1-1 to 1-9, Comparative Examples 1-11 to 1-19, and Reference Examples 1-21 to 1-24 thus prepared was left to stand for 1 month, in a nitrogen atmosphere at room temperature. As a result, the fine particle dispersions prepared in Examples 1-1 to 1-9, Comparative Examples 1-11 to 1-18, and Reference Examples 1-21 to 1-24 remained black. On the other hand, in the fine particle dispersion prepared in Comparative Example 1-19, the fine particles were agglomerated and precipitated, and the supernatant was transparent. Thus, in the fine particle dispersions prepared in Examples 1-1 to 1-9, Comparative Examples 1-11 to 1-18, and Reference Examples 1-21 to 1-24, the metal-containing fine particles were considered to have their surface coated with the dispersants, whereby the fine particle dispersions were confirmed to have excellent dispersion stability.

Further, from the results shown in the above Table 1, it was confirmed that from the fine particle dispersions prepared in Examples 1-1 to 1-9, metal films having a low volume resistivity can be formed by firing.

Examples 2-1 to 2-9, Comparative Examples 2-11 to 2-19, Reference Examples 2-21 to 2-24

Ag Colloid

In a glass container, 14 g of sodium citrate dihydrate and 10 g of iron(II) sulfide heptahydrate were dissolved in 60 g of distilled water to obtain an aqueous solution. To this aqueous solution, 25 g of a 10% silver nitrate aqueous solution (concentration as calculated by mass, the same applies hereinafter) was added, and a precipitate produced was subjected to centrifugal separation and then dispersed in 1 kg of distilled water. Then, to 25 g of this solution, a solution having 0.04 g of dodecylamine and 0.01 g of methyloctadecylamine dissolved in 2.5 g of cyclohexane was added, followed by stirring for 1 hour. While stirring the solution after the addition, 2.5 g of sodium chloride was further added thereto. Then, the solution was left to stand for 1 hour to be separated into an aqueous layer and an oil layer, and then the oil layer alone was recovered to obtain a black fine particle dispersion having Ag colloidal particles dispersed.

The fine particle dispersion obtained was applied on a glass substrate and dried, and then the deposit thus formed was fired in a nitrogen atmosphere at 200° C. for 1 hour, whereby a metal film having a metal silver color with a gloss was formed. The volume resistivity of the metal film was measured, and as a result, it was 5 μΩcm.

In the same manner, the fine particle dispersion was prepared except that dispersant 1 was used instead of dodecylamine and dispersant 2 was used instead of methyloctadecylamine, firing was carried out for 1 hour at a prescribed firing temperature to form a metal film, and the volume resistivity was measured. As a result, dispersants 1 and 2, and the firing temperatures are shown in the following Table 2 (No. 1). Further, with respect to a case of using one type of dispersant as in Comparative Examples, and a case of using two types of dispersants but not corresponding to Examples in the fourth embodiment because of the relation between the vaporization temperature and the firing temperature, as in Reference Examples, fine particle dispersions were prepared, and the volume resistivity of the metal film was measured in the same manner as in Examples. The results are shown in the following Table 2 (No. 2) and Table 2 (No. 3). Here, in the following Table 2 (No. 2) and Table 2 (No. 3), "X" represents "not measurable".

TABLE 2 (No. 1)

| Example | Dispersant 1 Vaporization temperature | Dispersant 2 Vaporization temperature | Firing temperature (° C.) | Volume resistivity (μΩcm) |
| --- | --- | --- | --- | --- |
| 2-1 | Dodecylamine 180° C. | Methyl-octadecylamine 210° C. | 200° C. | 5 |
| 2-2 | Tetradecylamine 190° C. | Dimethyl-octadecylamine 215° C. | 200° C. | 9 |
| 2-3 | Hexadecylamine 200° C. | Dimethyl-octadecylamine 215° C. | 210° C. | 4 |
| 2-4 | Dodecylamine 180° C. | Octadecylamine 205° C. | 200° C. | 7 |
| 2-5 | Dodecylamine 180° C. | Dodecanoic acid 200° C. | 190° C. | 11 |
| 2-6 | Dodecylamine 180° C. | Dodecanethiol 205° C. | 200° C. | 5 |
| 2-7 | Tetradecylamine 190° C. | Dodecanoic acid 200° C. | 195° C. | 10 |
| 2-8 | Dodecanoic acid 200° C. | Tetradecanethiol 220° C. | 210° C. | 6 |
| 2-9 | Hexadecylamine 200° C. | Tetradecanethiol 220° C. | 210° C. | 9 |

TABLE 2 (No. 2)

| Comparative Example | Dispersant 1 Vaporization temperature | Dispersant 2 Vaporization temperature | Firing temperature (° C.) | Volume resistivity (μΩcm) |
| --- | --- | --- | --- | --- |
| 2-11 | Dodecylamine 180° C. | — | 200° C. | X |
| 2-12 | Tetradecylamine 190° C. | — | 200° C. | X |
| 2-13 | Hexadecylamine 200° C. | — | 210° C. | 1000 |
| 2-14 | Dodecanoic acid 200° C. | — | 210° C. | X |
| 2-15 | Dodecylamine 180° C. | — | 150° C. | 250 |
| 2-16 | Tetradecylamine 190° C. | — | 180° C. | 65 |
| 2-17 | Hexadecylamine 200° C. | — | 180° C. | 80 |
| 2-18 | Dodecanoic acid 200° C. | — | 190° C. | 130 |

TABLE 2 (No. 3)

| Reference Example | Dispersant 1 Vaporization temperature | Dispersant 2 Vaporization temperature | Firing temperature (° C.) | Volume resistivity (μΩcm) |
| --- | --- | --- | --- | --- |
| 2-21 | Methyl-octadecylamine 210° C. | Dodecylamine 180° C. | 220° C. | X |
| 2-22 | Dimethyl-octadecylamine 215° C. | Tetradecylamine 190° C. | 230° C. | X |
| 2-23 | Hexadecylamine 200° C. | Tetradecylamine 190° C. | 180° C. | 90 |
| 2-24 | Dimethyl-octadecylamine 215° C. | Hexadecylamine 200° C. | 190° C. | 120 |

Comparative Example 2-19

A fine particle dispersion was prepared in the same manner as in Example 2-1 except that 0.05 g of propylamine was used instead of 0.04 g of dodecylamine and 0.01 g of methyloctadecylamine.

Each fine particle dispersion in Examples 2-1 to 2-9, Comparative Examples 2-11 to 2-19, and Reference Examples 2-21 to 2-24 thus prepared, was left to stand for 1 day in nitrogen and at room temperature. As a result, the fine particle dispersions prepared in Examples 2-1 to 2-9, Comparative Examples 2-11 to 2-18, and Reference Examples 2-21 to 2-24 remained black. On the other hand, in the fine particle dispersion prepared in Comparative Example 2-19, the fine particles are agglomerated and precipitated, and the supernatant became transparent.

Thus, in the fine particle dispersions prepared in Examples 2-1 to 2-9, Comparative Examples 2-11 to 2-18, and Reference Examples 2-21 to 2-24, the metal-containing fine particles were considered to have their surfaces coated with dispersants, whereby the fine particle dispersions were confirmed to have excellent dispersion stability.

Further, from the results shown in the above Table 2, it was confirmed that the fine particle dispersions prepared in Examples 2-1 to 2-9 can form metal films having a low volume resistivity by firing.

Examples 3-1 to 3-9, Comparative Examples 3-11 to 3-19, Reference Examples 3-21 to 3-24

Au Colloid

In a glass container, 1.5 g of chloroauric acid was dissolved in 150 g of distilled water to obtain an aqueous solution. While this aqueous solution was heated and boiled, 3 g of a 1% citric acid aqueous solution (concentration as calculated by mass, the same applies hereinafter) was added thereto. After 90 seconds, color of the liquid was changed to red. Then, to 150 g of such a solution, a solution having 0.04 g of dodecylamine and 0.01 g of methyloctadecylamine dissolved in 5 g of n-octane was added, followed by stirring for 1 hour. After completion of the addition, while the solution was stirred, 2.5 g of sodium chloride was further added thereto. Then, the solution was left to stand for 1 hour to be separated into an aqueous layer and an oil layer, and the oil layer alone was recovered to obtain a blackish brown fine particle dispersion having Au colloid.

The fine particle dispersion obtained was applied on a glass substrate and dried, and then the deposit thus formed was fired in a nitrogen atmosphere at 200° C. for 1 hour, whereupon a metal film colored metal gold with a gloss was formed. The volume resistivity of the metal film was measured and as a result, it was 6 μΩcm.

The fine particle dispersion was similarly prepared except that dispersant 1 was used instead of dodecylamine and dispersant 2 was used instead of methyloctadecylamine, fired at a prescribed firing temperature for 1 hour to form a metal film, and the volume resistivity was measured. As a result, dispersants 1 and 2, and the firing temperatures are shown in the following Table 3 (No. 1). Further, in a case of using one type of dispersant as Comparative Examples and a case not corresponding to Examples in the fourth embodiment from the relation between the vaporization temperature and the firing temperature, although two types of dispersants were used as Reference Examples, fine particle dispersions were prepared in the same manner as in Examples, and the volume resistivity of the metal film was measured. The results are shown in the following Table 3 (No. 2) and Table 3 (No. 3). Here, in the following Table 3 (No. 2) and Table 3 (No. 3), "X" represents incapable measurement.

TABLE 3 (No. 1)

| Example | Dispersant 1 Vaporization temperature | Dispersant 2 Vaporization temperature | Firing temperature (° C.) | Volume resistivity (μΩcm) |
|---|---|---|---|---|
| 3-1 | Dodecylamine 180° C. | Methyl-octadecylamine 210° C. | 200° C. | 6 |
| 3-2 | Tetradecylamine 190° C. | Dimethyl-octadecylamine 215° C. | 200° C. | 8 |
| 3-3 | Hexadecylamine 200° C. | Dimethyl-octadecylamine 215° C. | 210° C. | 4 |
| 3-4 | Dodecylamine 180° C. | Octadecylamine 205° C. | 200° C. | 8 |
| 3-5 | Dodecylamine 180° C. | Dodecanoic acid 200° C. | 190° C. | 18 |
| 3-6 | Dodecylamine 180° C. | Dodecanethiol 205° C. | 200° C. | 6 |
| 3-7 | Tetradecylamine 190° C. | Dodecanoic acid 200° C. | 195° C. | 11 |
| 3-8 | Dodecanoic acid 200° C. | Tetradecanethiol 220° C. | 210° C. | 5 |
| 3-9 | Hexadecylamine 200° C. | Tetradecanethiol 220° C. | 210° C. | 9 |

TABLE 3 (No. 2)

| Comparative Example | Dispersant 1 Vaporization temperature | Dispersant 2 Vaporization temperature | Firing temperature (° C.) | Volume resistivity (μΩcm) |
|---|---|---|---|---|
| 3-11 | Dodecylamine 180° C. | — | 200° C. | 650 |
| 3-12 | Tetradecylamine 190° C. | — | 200° C. | X |
| 3-13 | Hexadecylamine 200° C. | — | 210° C. | X |
| 3-14 | Dodecanoic acid 200° C. | — | 210° C. | X |
| 3-15 | Dodecylamine 180° C. | — | 150° C. | 550 |
| 3-16 | Tetradecylamine 190° C. | — | 180° C. | 170 |
| 3-17 | Hexadecylamine 200° C. | — | 180° C. | 210 |
| 3-18 | Dodecanoic acid 200° C. | — | 190° C. | 350 |

TABLE 3 (No. 3)

| Reference Example | Dispersant 1 Vaporization temperature | Dispersant 2 Vaporization temperature | Firing temperature (° C.) | Volume resistivity (μΩcm) |
|---|---|---|---|---|
| 3-21 | Methyl-octadecylamine 210° C. | Dodecylamine 180° C. | 220° C. | 800 |
| 3-22 | Dimethyl-octadecylamine 215° C. | Tetradecylamine 190° C. | 230° C. | X |
| 3-23 | Hexadecylamine 200° C. | Tetradecylamine 190° C. | 180° C. | 110 |
| 3-24 | Dimethyl-octadecylamine 215° C. | Hexadecylamine 200° C. | 190° C. | 230 |

Comparative Example 3-19

A fine particle dispersion was prepared in the same manner as in Example 3-1 except that 0.05 g of propylamine was used instead of 0.04 g of dodecylamine and 0.01 g of methyloctadecylamine.

Each fine particle dispersion in Examples 3-1 to 3-9, Comparative Examples 3-11 to 3-19, and Reference Examples 3-21 to 3-24 thus prepared was left to stand for 1 month in a nitrogen atmosphere and at room temperature. As a result, the fine particle dispersions prepared in Examples 3-1 to 3-9, Comparative Examples 3-11 to 3-18, and Reference Examples 3-21 to 3-24 remained black. On the other hand, in the fine particle dispersion prepared in Comparative Example 3-19, the fine particles were agglomerated and precipitated, and the supernatant was transparent. Thus, in the fine particle dispersions prepared in Examples 3-1 to 3-9, Comparative Examples 3-11 to 3-18, and Reference Examples 3-21 to 3-24, the metal-containing fine particles were considered to have their surface coated with dispersants, whereby it was confirmed that the fine particle have excellent dispersion stability.

Further, from the results shown in the above Table 3, it was confirmed that the fine particle dispersions prepared in Examples 3-1 to 3-9 can form metal films having a low volume resistivity by firing.

Examples 4-1 to 4-9, Comparative Examples 4-11 to 4-19, Reference Examples 4-21 to 4-24

Ni Colloid

In a glass container, 5 g of nickel (II) chloride dihydrate was dissolved in 150 g of distilled water to obtain an aqueous solution. To this aqueous solution, 90 g of a 40% citric acid aqueous solution (concentration as calculated by mass, the same applies hereinafter) was added, and a solution having 0.08 g of dodecylamine and 0.02 g of methyloctadecylamine dissolved in 10 g of n-hexane was further added thereto. While stirring the solution vigorously, after the addition, 150 g of a 3% sodium borohydride aqueous solution was slowly dropwise added thereto. After completion of the dropwise addition, the solution was left to stand for 1 hour to be separated into an aqueous layer and an oil layer, and the oil layer alone was recovered to obtain a black fine particle dispersion having Ni colloid particles dispersed.

The fine particle dispersion obtained was applied on a glass substrate and dried, and then the deposit thus formed was fired in a nitrogen atmosphere at 200° C. for 1 hour, whereby a metal film colored gray was formed. The volume resistivity of the metal film was measured, and as a result, it was 23 μΩcm.

In the same manner as, the fine particle dispersion was similarly prepared except that dispersant 1 was used instead of dodecylamine and dispersant 2 was used instead of methyloctadecylamine, firing was carried out for 1 hour at a prescribed firing temperature to form a metal film, and the volume resistivity was measured. As a result, dispersants 1 and 2, and the firing temperatures are shown in the following Table 4 (No. 1). Further, with respect to a case of using one type of dispersant as in Comparative Examples, and a case of using two types of dispersants but not corresponding to Examples in the fourth embodiment because of the relation between the vaporization temperature and the firing temperature, as in Reference Examples, fine particle dispersions were prepared in the same manner as in Examples, and the volume resistivity of the metal film was measured. The results are shown in the following Table 4 (No. 2) and Table 4 (No. 3). Here, in the following Table 4 (No. 2) and Table 4 (No. 3), "X" represents incapable "not measurable".

TABLE 4 (No. 1)

| Example | Dispersant 1 Vaporization temperature | Dispersant 2 Vaporization temperature | Firing temperature (° C.) | Volume resistivity (μΩcm) |
|---|---|---|---|---|
| 4-1 | Dodecylamine 180° C. | Methyl-octadecylamine 210° C. | 200° C. | 23 |
| 4-2 | Tetradecylamine 190° C. | Dimethyl-octadecylamine 215° C. | 200° C. | 30 |
| 4-3 | Hexadecylamine 200° C. | Dimethyl-octadecylamine 215° C. | 210° C. | 29 |
| 4-4 | Dodecylamine 180° C. | Octadecylamine 205° C. | 200° C. | 35 |
| 4-5 | Dodecylamine 180° C. | Dodecanoic acid 200° C. | 190° C. | 22 |
| 4-6 | Dodecylamine 180° C. | Dodecanethiol 205° C. | 200° C. | 27 |
| 4-7 | Tetradecylamine 190° C. | Dodecanoic acid 200° C. | 195° C. | 24 |
| 4-8 | Dodecanoic acid 200° C. | Tetradecanethiol 220° C. | 210° C. | 31 |
| 4-9 | Hexadecylamine 200° C. | Tetradecanethiol 220° C. | 210° C. | 29 |

TABLE 4 (No. 2)

| Comparative Example | Dispersant 1 Vaporization temperature | Dispersant 2 Vaporization temperature | Firing temperature (° C.) | Volume resistivity (μΩcm) |
|---|---|---|---|---|
| 4-11 | Dodecylamine 180° C. | — | 200° C. | X |
| 4-12 | Tetradecylamine 190° C. | — | 200° C. | 350 |
| 4-13 | Hexadecylamine 200° C. | — | 210° C. | X |
| 4-14 | Dodecanoic acid 200° C. | — | 210° C. | 1500 |
| 4-15 | Dodecylamine 180° C. | — | 150° C. | 1500 |
| 4-16 | Tetradecylamine 190° C. | — | 180° C. | 530 |
| 4-17 | Hexadecylamine 200° C. | — | 180° C. | 780 |
| 4-18 | Dodecanoic acid 200° C. | — | 190° C. | 820 |

TABLE 4

(No. 3)

| Reference Example | Dispersant 1 Vaporization temperature | Dispersant 2 Vaporization temperature | Firing temperature (° C.) | Volume resistivity (μΩcm) |
|---|---|---|---|---|
| 4-21 | Methyloctadecylamine 210° C. | Dodecylamine 180° C. | 220° C. | X |
| 4-22 | Dimethyloctadecylamine 215° C. | Tetradecylamine 190° C. | 230° C. | 580 |
| 4-23 | Hexadecylamine 200° C. | Tetradecylamine 190° C. | 180° C. | 680 |
| 4-24 | Dimethyloctadecylamine 215° C. | Hexadecylamine 200° C. | 190° C. | 800 |

Comparative Examples 4-19

A fine particle dispersion was prepared in the same manner as in Example 4-1 except that 0.1 g of propylamine (vaporization temperature: 40° C.) was used instead of 0.08 g of dodecylamine and 0.02 g of methyloctadecylamine.

Each fine particle dispersion in Examples 4-1 to 4-9, Comparative Examples 4-11 to 4-19, and Reference Examples 4-21 to 4-24 thus prepared was left to stand for 1 month in a nitrogen atmosphere at room temperature. As a result, the fine particle dispersions prepared in Examples 4-1 to 4-9, Comparative Examples 4-11 to 4-18, and Reference Examples 4-21 to 4-24 remained black. On the other hand, in the fine particle dispersion prepared in Comparative Example 4-19, the fine particles were agglomerated and precipitated, and the supernatant became transparent. Thus, in the fine particle dispersions prepared in Examples 4-1 to 4-9, Comparative Examples 4-11 to 4-18, and Reference Examples 4-21 to 4-24, the metal-containing fine particles were considered to have their surface coated with dispersants, whereby it was confirmed that the fine particle dispersions have excellent dispersion stability.

Further, from the results shown in the above Table 4, it was confirmed that the fine particle dispersions prepared in Examples 4-1 to 4-9 can form metal films having a low volume resistivity by firing.

Examples 5-1 to 5-9, Comparative Examples 5-11 to 5-19, Reference Examples 5-21 to 5-24

CuH Colloid

In a glass container, 5 g of copper (II) chloride dihydrate was dissolved in 150 g of distilled water to obtain an aqueous solution. To this aqueous solution, 90 g of a 40% citric acid aqueous solution (concentration as calculated by mass, the same applies hereinafter) was added, and a solution having 0.08 g of dodecylamine and 0.02 g of methyloctadecylamine dissolved in 10 g of toluene was further added thereto. While stirring the solution vigorously, after the addition 150 g of a 3% solution borohydride aqueous solution was slowly dropwise added thereto. After completion of the dropwise addition, the solution was left to stand for 1 hour to be separated into an aqueous layer and an oil layer, and then the oil layer alone was recovered to obtain a black fine particle dispersion having CuH colloidal particles dispersed therein.

To the fine particle dispersion obtained, 10 g of AF solvent (manufactured by Nippon Oil Corporation) was added, and then the pressure was reduced by using a vacuum pump at room temperature to vaporize toluene, followed by solvent substitution.

The fine particle dispersion having AF solvent as a dispersion medium, thus obtained, was applied on a glass substrate and dried, and then the deposit thus formed was fired in a nitrogen atmosphere at 200° C. for 1 hour, whereby the metal film having a metal copper color with a gloss was formed. The volume resistivity of this metal film was measured, and as a result, it was 7 μΩcm.

In the same manner, the fine particle dispersion was prepared except that dispersant 1 was used instead of dodecylamine and dispersant 2 was used instead of methyloctadecylamine, firing was carried out for 1 at a prescribed firing temperature hour to form a metal film, and the volume resistivity was measured. As a result, dispersants 1 and 2, and the firing temperatures were shown in the following Table 13. Further, with respect to a case of using one type of dispersant as Comparative Example, and a case of using two types of dispersants but not corresponding to Examples in the fourth embodiment because of the relation between the vaporization temperature and the firing temperature, as in Reference Examples, the fine particle dispersions were prepared, and the volume resistivity of the metal film was measured in the same manner as in Examples. The results are shown in the following Tables 14 and 15. Here, in the following Table 14 and 15, "X" represents "not measurable".

TABLE 13

| Example | Dispersant 1 Vaporization temperature | Dispersant 2 Vaporization temperature | Firing temperature (° C.) | Volume resistivity (μΩcm) |
|---|---|---|---|---|
| 5-1 | Dodecylamine 180° C. | Methyloctadecylamine 210° C. | 200° C. | 8 |
| 5-2 | Tetradecylamine 190° C. | Dimethyloctadecylamine 215° C. | 200° C. | 7 |
| 5-3 | Hexadecylamine 200° C. | Dimethyloctadecylamine 215° C. | 210° C. | 8 |

TABLE 13-continued

| Example | Dispersant 1 Vaporization temperature | Dispersant 2 Vaporization temperature | Firing temperature (° C.) | Volume resistivity (μΩcm) |
|---|---|---|---|---|
| 5-4 | Dodecylamine 180° C. | Octadecylamine 205° C. | 200° C. | 9 |
| 5-5 | Dodecylamine 180° C. | Dodecanoic acid 200° C. | 190° C. | 11 |
| 5-6 | Dodecylamine 180° C. | Dodecanethiol 205° C. | 200° C. | 11 |
| 5-7 | Tetradecylamine 190° C. | Dodecanoic acid 200° C. | 195° C. | 9 |
| 5-8 | Dodecanoic acid 200° C. | Tetradecanethiol 220° C. | 210° C. | 11 |
| 5-9 | Hexadecylamine 200° C. | Tetradecanethiol 220° C. | 210° C. | 13 |

TABLE 14

(No. 2)

| Comparative Example | Dispersant 1 Vaporization temperature | Dispersant 2 Vaporization temperature | Firing temperature (° C.) | Volume resistivity (μΩcm) |
|---|---|---|---|---|
| 5-11 | Dodecylamine 180° C. | — | 200° C. | X |
| 5-12 | Tetradecylamine 190° C. | — | 200° C. | 400 |
| 5-13 | Hexadecylamine 200° C. | — | 210° C. | 650 |
| 5-14 | Dodecanoic acid 200° C. | — | 210° C. | 900 |
| 5-15 | Dodecylamine 180° C. | — | 150° C. | 40 |
| 5-16 | Tetradecylamine 190° C. | — | 180° C. | 90 |
| 5-17 | Hexadecylamine 200° C. | — | 180° C. | 100 |
| 5-18 | Dodecanoic acid 200° C. | — | 190° C. | 110 |

TABLE 15

| Reference Example | Dispersant 1 Vaporization temperature | Dispersant 2 Vaporization temperature | Firing temperature (° C.) | Volume resistivity (μΩcm) |
|---|---|---|---|---|
| 5-21 | Methyloctadecylamine 210° C. | Dodecylamine 180° C. | 220° C. | X |
| 5-22 | Dimethyloctadecylamine 215° C. | Tetradecylamine 190° C. | 230° C. | X |
| 5-23 | Hexadecylamine 200° C. | Tetradecylamine 190° C. | 180° C. | 110 |
| 5-24 | Dimethyloctadecylamine 215° C. | Hexadecylamine 200° C. | 190° C. | 120 |

Comparative Examples 5-19

A fine particle dispersion was prepared in the same manner as in Example 5-1 except that 0.1 g of propylamine was used instead of 0.08 g of dodecylamine and 0.02 g of methyloctadecylamine.

Each fine particle dispersion in Examples 5-1 to 5-9, Comparative Examples 5-11 to 5-19, and Reference Examples 5-21 to 5-24 thus prepared was left to stand for 1 month in a nitrogen atmosphere and at room temperature. As a result, the fine particle dispersions prepared in Examples 5-1 to 5-9, Comparative Examples 5-11 to 5-18, and Reference Examples 5-21 to 5-24 remained black. On the other hand, in the fine particle dispersion prepared in Comparative Example 5-19, the fine particles were agglomerated and precipitated, and the supernatant became transparent. Thus, in the fine particle dispersions prepared in Examples 5-1 to 5-9, Comparative Examples 5-11 to 5-18, and Reference Examples 5-21 to 5-24, the metal-containing fine particles were considered to have their surface coated with dispersants, whereby it was confirmed that the fine particle dispersions have excellent dispersion stability.

Further, from the results shown in the above Table 13, it was confirmed that the fine particle dispersions prepared in Examples 5-1 to 5-9 can form metal films having a low volume resistivity by firing.

As understood from the results shown in the above Tables 1 to 15, a metal film formed by using the fine particle dispersion obtained by dispersing the metal-containing fine particles (CuH colloid, Ag colloid, Au colloid or Ni colloid) having their surface coated with a dispersant to be vaporized at a temperature lower than the firing temperature and a dispersant to be vaporized at a temperature of the firing temperature or higher, was found to have a remarkably low volume resistance.

The entire disclosure of Japanese Patent Application No. 2004-68065 (filed on Mar. 10, 2004) including specification, claims and summary is incorporated herein by reference in its entirety.

What is claimed is:

1. A process for producing an electroconductive metal-containing material, the process comprising a step of adding water to a water-soluble metal-containing compound to obtain an aqueous solution containing metal ions;

a step of adding to the aqueous solution a water-insoluble organic liquid having at least two dispersants different in vaporization temperature dissolved therein;

then a step of adding to the aqueous solution a reducing agent with stirring to reduce the metal ions, produce metal-containing particles having their surface coated with the at least two dispersants different in vaporization temperature, and produce a particle dispersion by dispersing in the water-insoluble organic liquid the metal-containing particles having their surface coated with the at least two dispersants different in vaporization temperature;

separating the particle dispersion from the aqueous solution;

coating an object with a coating containing particles from the particle dispersion;

firing the coating at a temperature between the highest vaporization temperature and the lowest vaporization temperature among the vaporization temperatures of the at least two dispersants to produce an electroductive metal-containing material having a volume resistivity of at most 60 µΩcm.

2. A process for producing an electroconductive metal-containing material, the process comprising a step of obtaining an aqueous solution containing citric ions and ferric ions;

a step of addition to the aqueous solution containing citric ions and ferric ions an aqueous solution containing ions of at least one metal selected from the group consisting of gold, silver, platinum, palladium, tungsten, tantalum, bismuth, lead, indium, tin, titanium and aluminum, with stirring, to reduce the ions of at least one metal to obtain a liquid containing metal-containing particles;

a step of adding to the liquid containing the metal-containing particles a water-insoluble organic liquid having at least two dispersants different in vaporization temperature dissolved therein, with stirring, to produce metal-containing particles having their surface coated with the at least two dispersants different in vaporization temperature, and produce a particle dispersion by dispersing in the water-insoluble organic liquid the metal-containing particles having their surface coated with the at least two dispersants different in vaporization temperature;

separating the particle dispersion from the aqueous solution;

coating an object with a coating containing particles from the particle dispersion; and firing the coating at a temperature between the highest vaporization temperature and the lowest vaporization temperature among the vaporization temperatures of the at least two dispersants to produce an electroductive metal-containing material having a volume resistivity of at most 60 µΩcm.

3. The process according to claim 1, wherein the at least two dispersants are independently selected from the group consisting of organic compounds containing, as a substituent which can be coordinated to a metal element, at least one nitrogen atom, oxygen atom or sulfur atom.

4. The process according to claim 2, wherein the at least two dispersants are independently selected from the group consisting of organic compounds containing, as a substituent which can be coordinated to a metal element, at least one nitrogen atom, oxygen atom or sulfur atom.

5. The process according to claim 1, wherein the at least two dispersants independently contain from 4 to 25 carbon atoms.

6. The process according to claim 2, wherein the at least two dispersants independently contain from 4 to 25 carbon atoms.

7. The process according to claim 1, wherein the firing is at a temperature that is different than the vaporization temperature of each of the at least two dispersants by no more than 25° C.

8. The process according to claim 2, wherein the firing is at a temperature that is different than the vaporization temperature of each of the at least two dispersants by no more than 25° C.

* * * * *